(12) United States Patent
Oh et al.

(10) Patent No.: US 7,338,885 B2
(45) Date of Patent: Mar. 4, 2008

(54) ALIGNMENT MARK AND METHOD FOR MANUFACTURING A SEMICONDUCTOR DEVICE HAVING THE SAME

(75) Inventors: Myoung-Hwan Oh, Yongin-si (KR); Hee-Sung Kang, Sungnam-si (KR); Chang-Hyun Park, Suwon-si (KR)

(73) Assignee: Samsnung Electronics Co., Ltd. (KR)

( * ) Notice: Subject to any disclaimer, the term of this patent is extended or adjusted under 35 U.S.C. 154(b) by 132 days.

(21) Appl. No.: 10/874,052

(22) Filed: Jun. 22, 2004

(65) Prior Publication Data

US 2005/0009287 A1  Jan. 13, 2005

(30) Foreign Application Priority Data

Jul. 10, 2003 (KR) .................................... 03-46647

(51) Int. Cl.
*H01L 21/78* (2006.01)
*H01L 21/46* (2006.01)
*H01L 21/301* (2006.01)
*H01L 21/76* (2006.01)
*H01L 23/544* (2006.01)

(52) U.S. Cl. ...................... 438/462; 438/401; 438/975; 257/797; 257/E23.179

(58) Field of Classification Search ................ 438/401, 438/462, 975; 257/797, E23.197, E23.179
See application file for complete search history.

(56) References Cited

U.S. PATENT DOCUMENTS

| | | | | |
|---|---|---|---|---|
| 5,369,050 A | * | 11/1994 | Kawai | .......................... 438/401 |
| 6,706,610 B2 | * | 3/2004 | Yoshimura et al. | .......... 438/401 |
| 6,809,002 B2 | * | 10/2004 | Yabe et al. | .................. 438/401 |
| 2002/0063304 A1 | * | 5/2002 | Toeda et al. | .................. 257/507 |
| 2002/0182821 A1 | | 12/2002 | Yabe et al. | |

FOREIGN PATENT DOCUMENTS

WO       01/67509 A1     9/2001

\* cited by examiner

*Primary Examiner*—Luan Thai
(74) *Attorney, Agent, or Firm*—Mills & Onello LLP

(57) ABSTRACT

In a method for manufacturing a semiconductor device having an alignment mark, a buffer layer is formed on a substrate. A trench is formed at an isolation region of the substrate. The trench is filled with an insulating layer. An alignment groove is formed on the insulating layer in a scribe lane region of the substrate. The buffer layer is removed to form an alignment pattern. An alignment mark includes the alignment pattern and the alignment groove. Therefore, the alignment pattern may be not attacked by solutions in a successive cleaning process such that the alignment mark may be not damaged and maintains its original shape.

18 Claims, 12 Drawing Sheets

ALIGNMENT MARK AND METHOD FOR MANUFACTURING A SEMICONDUCTOR DEVICE HAVING THE SAME

CROSS REFERENCE TO RELATED APPLICATION

This application claims priority under 35 USC § 119 to Korean Patent Application No. 2003-46647, filed on Jul. 10, 2003, the contents of which are herein incorporated by reference in their entirety for all purposes.

BACKGROUND OF THE INVENTION

1. Field of the Invention

The present invention relates to an alignment mark and a method for manufacturing a semiconductor device having the same. More particularly, the present invention relates to a method for forming an alignment mark that is appropriate for manufacturing a semiconductor device having a silicon-on-insulator substrate.

2. Description of the Related Art

Highly integrated semiconductor devices are required to rapidly process massive amounts of information. To meet the requirement, semiconductor devices need to operate at high speed. Accordingly, various technologies have been developed for manufacturing a semiconductor device having a rapid operation speed.

A technology in which a silicon-on-insulator (SOI) substrate is used is proposed. The SOI substrate has a single crystalline silicon layer that is formed on a buried oxide (BOX) layer. When a semiconductor device is formed on the SOI substrate, the semiconductor device, that is an SOI device, is divided into unit elements by the BOX layer, thereby preventing latch-up of a transistor in the semiconductor device and reducing parasitic capacitance. Thus, the SOI device may have reduced power consumption and a rapid operation speed compared to a device that is formed on a bulk silicon substrate.

Processes for manufacturing the SOI device require an alignment mark for patterning various layers. The alignment mark precisely aligns an SOI substrate with a mask used in an exposure process of a photoresist layer. The alignment mark may be formed on a scribe lane positioned between chips.

FIGS. 1A to 1C are cross sectional views illustrating a conventional method for forming an alignment mark on an SOI substrate.

Referring to FIG. 1A, an SOI substrate 10 has a silicon substrate 10a, a buried oxide (BOX) layer 10b and a silicon layer 10c. A typical isolation process is performed on the SOI substrate 10 to form an active region having an exposed surface and a field region having a field oxide layer 15 on the SOI substrate 10. The field oxide layer 15 contacts the BOX layer 10b.

The SOI substrate 10 is divided into device area D in which a semiconductor chip is formed and scribe lane area S positioned between the device areas D. Test chips, an alignment mark, etc., are formed on the scribe lane area S by successive processes.

The alignment mark includes an alignment pattern and an alignment groove adjacent to the alignment pattern. An aligner of exposure equipment recognizes the alignment mark by detecting depth of the alignment groove and an inclined angle of a sidewall of the alignment pattern in an exposure process, thereby aligning the SOI substrate 10. The closer the inclined angle of the sidewall approaches a right angle, the more readily the aligner recognizes the alignment mark.

Referring to FIG. 1B, a photoresist pattern 20 selectively exposing the scribe lane region S is formed on the SOI substrate 10. The exposed surface of the active region is dry etched using the photoresist pattern 20 as a mask and using an etchant that has an etching selectivity relative to silicon oxide, which is higher than that of silicon. In particular, the field oxide layer 15 positioned in the scribe lane region S and the BOX layer 10b beneath the field oxide layer 15 are etched using the etchant. In the etching process, the silicon layer 10c is rapidly etched compared to the field oxide layer 15 and the BOX layer 10b. Accordingly, a stepped structure having the alignment pattern 25 and the alignment groove is formed on the active region and the field region. The alignment pattern 25 is positioned in the active region and the alignment groove is positioned in the field region.

To recognize the alignment mark by the exposure equipment, the alignment pattern has a high height. Thus, the field oxide layer 15 and the BOX layer 10b are removed by a thickness of about thousands of angstroms (Å). Here, the silicon layer 10c is simultaneously removed by a thickness of about hundreds of angstroms.

When the silicon layer 10c has a thick thickness, a parasitic capacitance may greatly increase. To reduce the parasitic capacitance, the thickness of the silicon layer 10c has been thinned. In general, when the silicon layer 10c has a thickness of about hundreds of angstroms, the silicon layer 10c is entirely removed by the etching process to form the alignment pattern 25 that only has the BOX oxide layer 15.

Referring to FIG. 1C, the photoresist layer 20 is stripped using a stripping solution. A cleaning process using a cleaning solution is performed on the SOI substrate 10.

The alignment pattern 25 only having the BOX layer 15 may be attacked by the stripping solution and the cleaning solution. Particularly, since an upper edge portion of the alignment pattern 25a may be more attacked by the solutions, the upper edge portion of the alignment pattern 25a may be more crushed compared to other portions of the alignment pattern 25a.

It may be difficult to recognize the crushed alignment pattern 25a by the exposure equipment. As a result, a photoresist pattern used in the exposure process may be mis-aligned due to incorrectly recognizing the alignment mark or its location caused by the crushed alignment pattern 25a. Even further, the exposure process may be not carried out owing to recognition failure caused by the crushed alignment pattern 25a.

SUMMARY OF THE INVENTION

The present invention provides a method for manufacturing a semiconductor device including an alignment mark that suffers little or no damage in successive processes.

The present invention also provides a method for manufacturing a semiconductor device including an alignment mark appropriate for an SOI substrate.

In accordance with one aspect of the present invention, there is provided a method for manufacturing a semiconductor device. In the method, a buffer layer is formed on a substrate that includes an isolation region and a scribe line region. A trench is formed in the isolation region of the substrate. The trench is filled with an insulating layer. An alignment groove is formed in an upper portion of an insulating layer in the scribe lane region of the substrate. The remaining portion of the buffer layer is removed.

In one embodiment, the buffer layer includes silicon nitride, silicon oxynitride, polysilicon or amorphous silicon.

Forming the alignment groove may include: forming a photoresist pattern for selectively exposing the scribe lane region on the insulating layer; and etching the insulating layer using the photoresist pattern and the buffer layer as an etching mask. The insulating layer covers the substrate disposed below the alignment groove after etching the insulating layer.

In one embodiment, the buffer layer has a thickness of about 300 Å to about 3,000 Å.

The method may further include forming a pad oxide layer on the substrate prior to forming the buffer layer.

In one embodiment, the substrate includes a silicon on insulator (SOI) substrate or a silicon bulk substrate.

In one embodiment, filling the trench with the insulating layer includes: forming a silicon oxide layer on the buffer layer and in the trench; and removing the silicon oxide layer to expose a surface of the buffer layer.

In accordance with another aspect of the present invention, there is provided a method for manufacturing a semiconductor device. In the method, a buffer layer is formed on a silicon-on-insulator (SOI) substrate including a silicon substrate, a buried oxide layer and a semiconductor layer. The SOI substrate includes an isolation region and a scribe lane region. A trench is formed at the isolation region of the SOI substrate. The trench is filled with a field oxide layer. An alignment groove is formed at an upper portion of the field oxide layer in the scribe lane region of the SOI substrate. The buffer layer is removed.

In one embodiment, the buffer layer includes silicon nitride, silicon oxynitride, polysilicon or amorphous silicon.

In one embodiment, forming the alignment groove includes: forming a photoresist pattern for selectively exposing the scribe lane region on the field oxide layer; and etching a silicon oxide layer in the scribe lane region using the photoresist pattern and the buffer layer as an etching mask. The silicon oxide layer may include the field oxide layer and the buried oxide layer. The buried oxide layer may cover the silicon substrate disposed below the alignment groove after etching the silicon oxide layer. The buried oxide layer can be entirely removed to expose the silicon substrate disposed below the alignment groove.

In one embodiment, the method further includes: selectively removing the buffer layer remaining on the scribe lane region after forming the alignment groove; and epitaxially growing the semiconductor layer disposed in the scribe lane region. In one embodiment, the epitaxial layer has a thickness of about 50 Å to about 1,000 Å.

In one embodiment, the buffer layer has a thickness of about 300 Å to about 3,000 Å.

In one embodiment, the method further includes forming a pad oxide layer on the substrate prior to forming the buffer layer.

In one embodiment, filling the trench with the insulating layer includes: forming a silicon oxide layer on the buffer layer and in the trench; and removing the silicon oxide layer to expose a surface of the buffer layer. In accordance with another aspect of the present invention, there is provided an alignment mark. The alignment mark includes an alignment pattern formed on a scribe lane region of a silicon on insulator (SOI) substrate which includes a silicon substrate, a buried oxide layer and a semiconductor layer. The alignment pattern includes the buried oxide layer and the semiconductor layer and has an upper face positioned in a plane substantially identical to that of the SOI substrate. An alignment groove is adjacent to the alignment pattern.

In one embodiment, the alignment groove has a bottom face corresponding to the silicon substrate.

In one embodiment, the alignment groove has a bottom face corresponding to the buried oxide layer.

The alignment mark may further include an epitaxial layer formed on the semiconductor layer of the alignment pattern. In accordance with another aspect of the present invention, there is provided an alignment mark. The alignment mark includes an alignment pattern including a silicon oxide layer and a semiconductor layer formed on a scribe lane region of a SOI substrate, the SOI substrate having a silicon substrate, a silicon oxide layer and the semiconductor layer, and an alignment groove adjacent to the alignment pattern. The alignment pattern has an upper face higher than that of the SOI substrate.

According to the present invention, the buffer layer is formed on the scribe lane region. When the field oxide layer and the silicon oxide layer are etched, the buffer layer protects the semiconductor layer of the SOI substrate, thereby preventing partial removal of the semiconductor layer. As a result, the alignment pattern includes the silicon oxide layer and the semiconductor layer. Therefore, the semiconductor layer may be not attacked by solutions during a successive cleaning process such that the alignment mark may be not damaged maintaining an original shape.

BRIEF DESCRIPTION OF THE DRAWINGS

The above and other features and advantages of the invention will become readily apparent by reference to the following detailed description when considered in conjunction with the accompanying drawings.

DESCRIPTION OF THE PREFERRED EMBODIMENTS

Figure 1A:
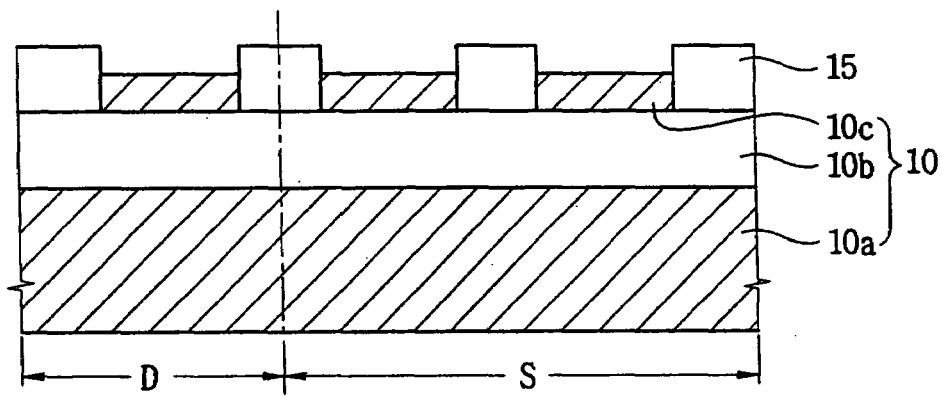
FIGS. 1A to 1C are cross sectional views illustrating a conventional method for forming an alignment mark on an SOI substrate.
Figure 1B:
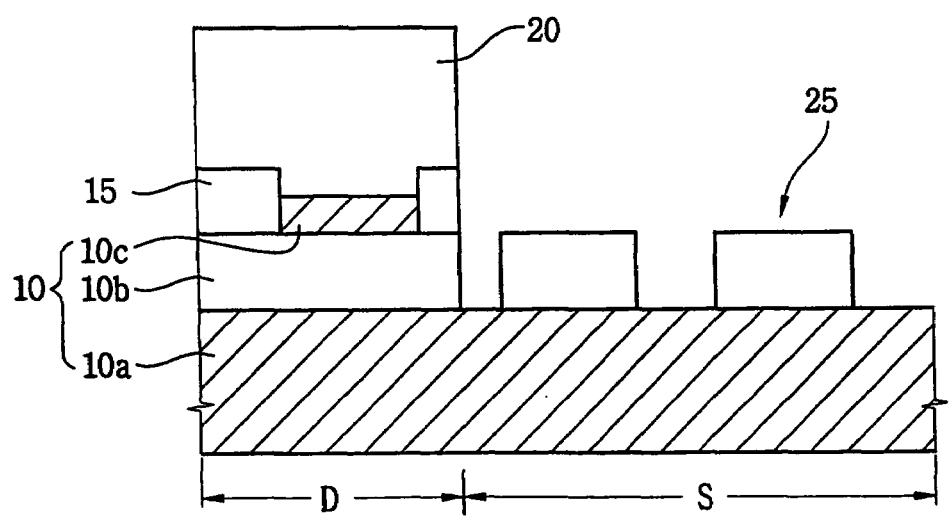
Figure 1C:
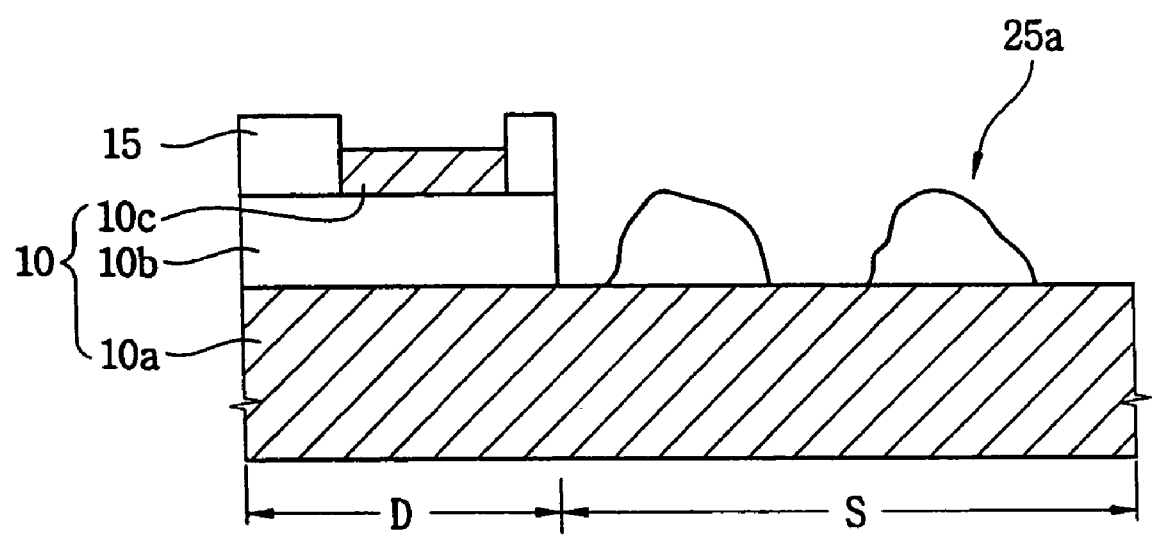

The present invention now will be described more fully hereinafter with reference to the accompanying drawings, in which embodiments of the present invention are shown. This invention may, however, be embodied in many different forms and should not be construed as limited to the embodiments set forth herein; rather, these embodiments are provided so that this disclosure will be thorough and complete, and will fully convey the scope of the present invention to those skilled in the art. In the drawings, the thickness of layers and regions are exaggerated for clarity. Like reference numerals refer to similar or identical elements throughout. It will be understood that when an element such as a layer, region or substrate is referred to as being "on" or "onto"

another element, it can be directly on the other element or intervening elements may also be present.

Hereinafter, an alignment mark and a method for forming an alignment mark according to the present invention are described in detail.

Figure 2:
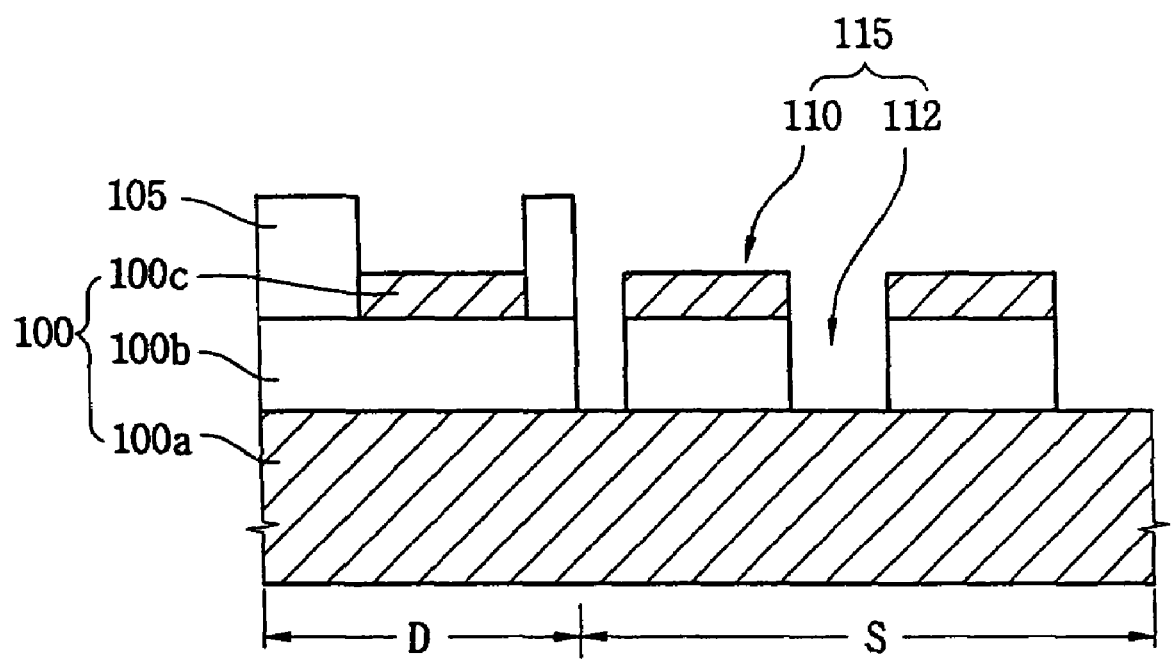
FIG. 2 is a cross sectional view illustrating an alignment mark in accordance with a first embodiment of the present invention.

FIG. 2 is a cross sectional view illustrating an alignment mark in accordance with a first embodiment of the present invention.

Referring to FIG. 2, an SOI substrate 100 includes a silicon substrate 100a, a buried oxide layer 100b and a silicon layer 100c. The SOI substrate 100 is defined a device region D and a scribe lane region S.

An active region and a field region are formed in the device region D. The active region includes the silicon layer 100c having an exposed upper face. The field region includes a field oxide layer 105 filling a trench that is formed at an upper portion of the SOI substrate 100. The field oxide layer 105 has a height higher than the silicon layer 100c.

An alignment mark 115 for aligning the SOI substrate 100 with a mask used in a photolithography process is formed on the scribe lane region S. The alignment mark 115 includes an alignment pattern 110 having the buried oxide layer 100b and the silicon layer 100c, and an alignment groove 112 adjacent to the alignment pattern 110.

The buried oxide layer 100b may partially remain on a bottom of the alignment groove 112. On the contrary, the buried oxide layer 100b in the alignment groove 112 may be entirely removed to expose a surface of the silicon substrate 100a.

The silicon layer 100c included in the alignment pattern 110 has a thickness substantially identical to that of the silicon layer 100c of the SOI substrate 100. That is, an upper face of the active region in the device region D is positioned in a plane substantially identical to that of the silicon layer 100c in the alignment pattern 110.

FIGS. 3A to 3E are cross sectional views illustrating a method for forming an alignment mark in accordance with the first embodiment of the present invention.

Figure 3A:
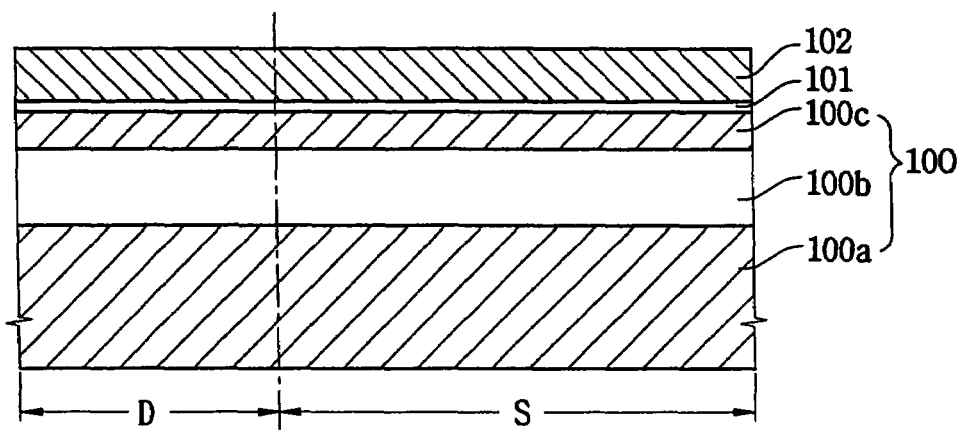
FIGS. 3A to 3E are cross sectional views illustrating a method for forming an alignment mark in accordance with the first embodiment of the present invention.

Referring to FIG. 3A, an SOI substrate 100 includes a silicon substrate 100a, a buried oxide layer 100b and a silicon layer 100c. The SOI substrate 100 may include a separation by implanted oxygen (SIMOX) substrate and an attachment type substrate. In a method for fabricating the SIMOX substrate, oxygen ions are implanted into a single crystalline silicon substrate. The oxygen ions react with silicon atoms by an annealing process of the single crystalline silicon substrate to form the buried oxide layer 100b on the single crystalline silicon substrate. In a method for fabricating the attachment type substrate, two single crystalline silicon substrates are attached to both faces of an oxide layer, respectively. Any one of the two single crystalline substrates is thinned to form the silicon layer 100c. Typically, the buried oxide layer 100b may have a thickness of about 500 Å to about 5,000 Å. The silicon layer 100c may have a thickness of about 30 Å to about 5,000 Å. The SOI substrate 100 is defined device regions D and a scribe lane region S formed between the device regions D.

A pad oxide layer 101 having a thickness of about 10 Å to about 300 Å is formed on the silicon layer 100c. A buffer layer 102 having a thickness of about 50 Å to about 10,000 Å is formed on the pad oxide layer 101. The buffer layer 102 may preferably have a thickness of about 300 Å to about 3,000 Å.

The buffer layer 102 serves as a polishing stop layer in a subsequent polishing process. The buffer layer 102 also protects the silicon layer 100c when an alignment mark is subsequently formed. When the buffer layer 102 is too thin, the buffer layer 102 may be partially removed in the polishing process such that the buffer layer 102 may not protect the silicon layer 100c during the formation of the alignment mark. On the contrary, when the buffer layer 102 is too thick, it may be difficult to form a trench through the buffer layer 102.

After a silicon oxide layer used for forming the alignment mark is etched, the buffer layer 102 must remain to protect the silicon layer 100c. Thus, the buffer layer 102 has a thickness proportional to the etched thickness of the silicon oxide layer. The buffer layer 102 may include silicon nitride, silicon oxynitride, polysilicon or amorphous silicon. The buffer layer 102 may advantageously include silicon nitride that has a high etching selectivity and a high polishing selectivity relative to silicon oxide.

Figure 3B:
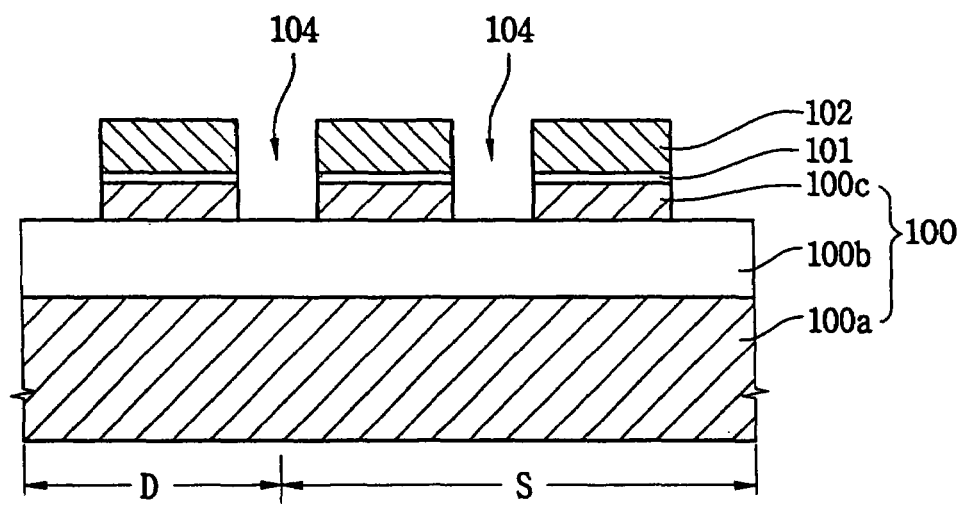

Referring to FIG. 3B, the buffer layer 102 and the silicon layer 100c in a field region are etched to form trench 104. The trench 104 may include a full trench through which the buried oxide layer 100b is exposed. Alternatively, the trench 104 may include a partial trench through which the buried oxide layer 102 is not exposed.

The field region is formed in the device region D and the scribe lane region S. The trench 104 is formed in the field region of the scribe lane region S in which an alignment groove is subsequently formed.

Figure 3C:
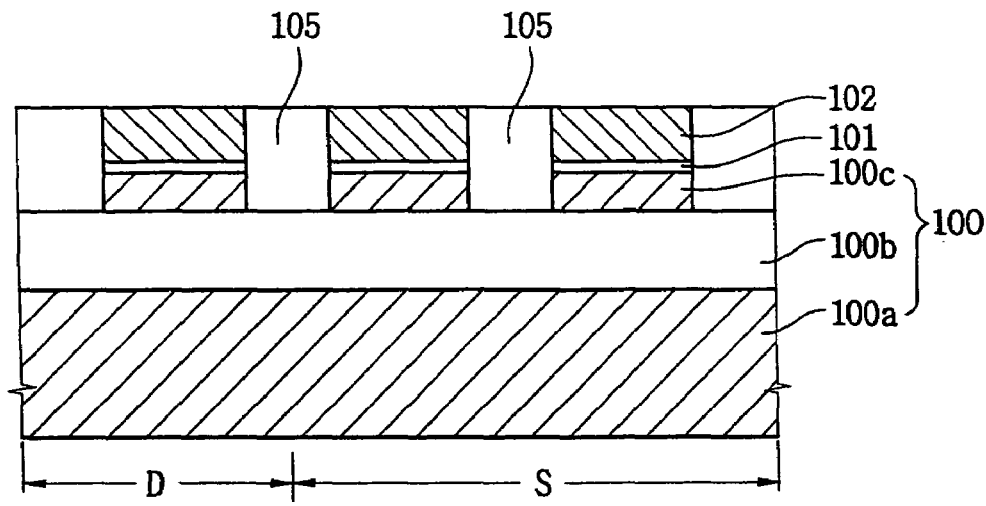

Referring to FIG. 3C, a field oxide layer 105 is formed on the buffer layer 102 and in the trench 104. The field oxide layer 105 may include silicon oxide. When the trench 104 is the full trench, a bottom of the field oxide layer 105 contacts an upper face of the buried oxide layer 100b. When the trench 104 is the partial trench, the bottom of the field oxide layer 105 does not contact the upper face of the buried oxide layer 100b.

The field oxide layer 105 is polished to expose the buffer layer 102. The field oxide layer 105 is selectively polished using a slurry that has a polishing selectivity between the buffer layer 102 and the field oxide layer 105. The field region is formed in the trench 104 by the polishing process. The buffer layer 102 also remains on the active region.

Figure 3D:
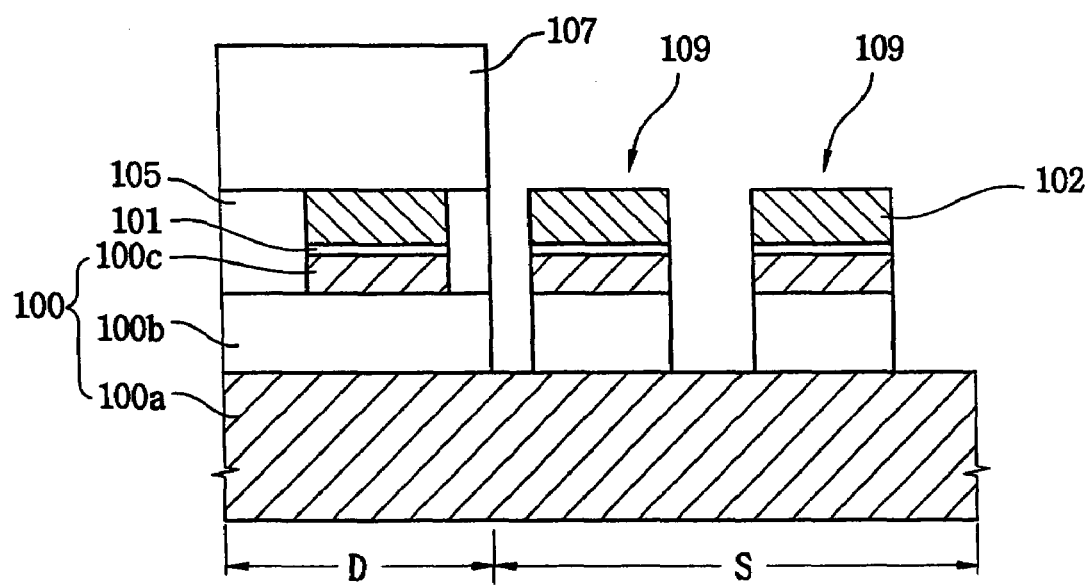

Referring to FIG. 3D, a photoresist pattern 107 is formed on the SOI substrate 100 to expose the scribe lane region S. The buried oxide layer 100b is dry etched using the photoresist pattern 107 as a mask and using an etchant that has an etching selectivity between the buried oxide layer 100b and the buffer layer 102. The etching selectivity between the buried oxide layer 100b and the buffer layer 102 is greater than about 5:1.

In particular, the field oxide layer 105 and the buried oxide layer 100b formed in the scribe lane region S are etched to form an alignment groove. Here, the buried oxide layer 105 may remain on a bottom of the alignment groove. On the contrary, the buried oxide layer 105 may be entirely removed to expose the silicon substrate 100a.

The buffer layer 102 is not etched and remains during the etching process of the field oxide layer 105 and the buried oxide layer 100b. Thus, a step is formed between the field region and the active region so that a preliminary alignment pattern 109 is formed in the active region adjacent to the alignment groove. The preliminary alignment pattern 109 includes the buried oxide layer 100b, the silicon layer 100c and the buffer layer 102 subsequently stacked on the silicon substrate 100a.

Figure 3E:
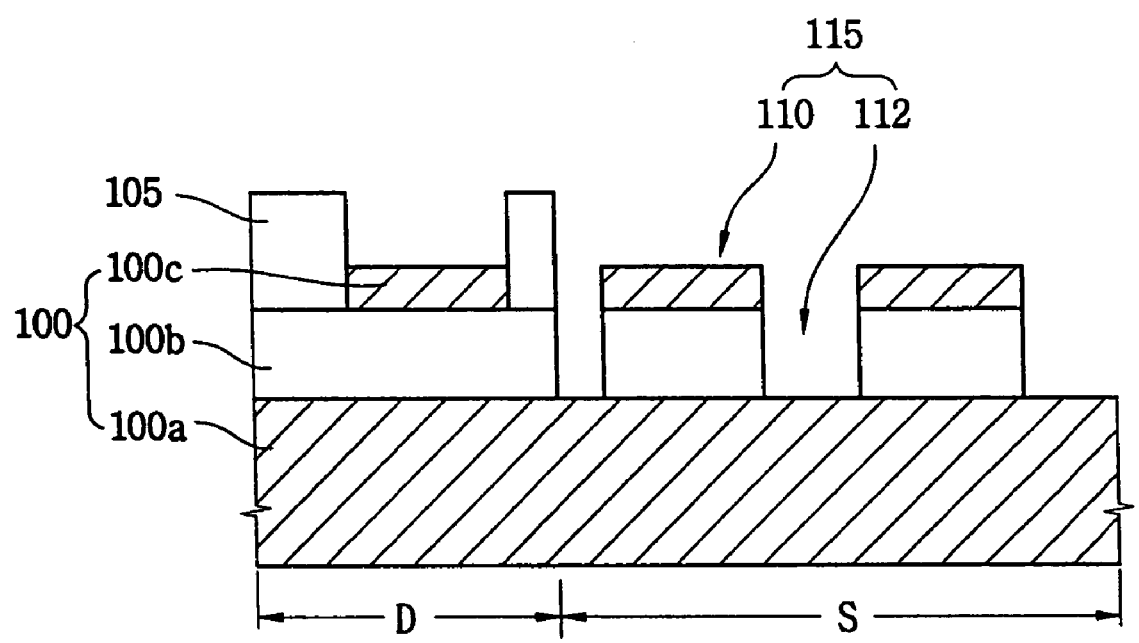

Referring to FIG. 3E, the photoresist pattern 107 is removed by a stripping process. The buffer layer 102 remaining in the device region D and the scribe lane region S is removed. When the buffer layer 102 includes silicon nitride, the buffer layer 102 may be removed using a phosphoric acid solution. The pad oxide layer 101 disposed beneath the buffer layer 102 is removed with the removal of the buffer layer 102.

As a result, an alignment mark 115 including an alignment pattern 110 and an alignment groove 112 is formed on the silicon substrate 100a. The alignment pattern 110 includes the buried oxide layer 100b and the silicon layer 100c subsequently stacked on the silicon substrate 100a.

The silicon layer 100c included in the alignment pattern 110 has a thickness substantially identical to that of the silicon layer 100c included in the SOI substrate 100. Namely, an upper face of the active region in the device region D is positioned in a plane substantially identical to that of the silicon layer 100c in the alignment pattern 110.

The silicon layer 100c included in the alignment pattern 110 may be little damaged by a cleaning solution compared to the buried oxide layer 100b. Accordingly, the upper face of the alignment pattern 110 may be nearly not damaged during carrying out successive processes such that the alignment pattern 110 is maintained in an original shape. Therefore, failures generated in an exposure process may be minimized due to the damage of the alignment pattern.

The method in accordance with this embodiment is illustrated as being employed in the SOI substrate. The method may be, however, employed in an SOI substrate that includes a silicon substrate, a buried oxide layer and a semiconductor layer. The semiconductor layer may include silicon germanium.

Figure 4:
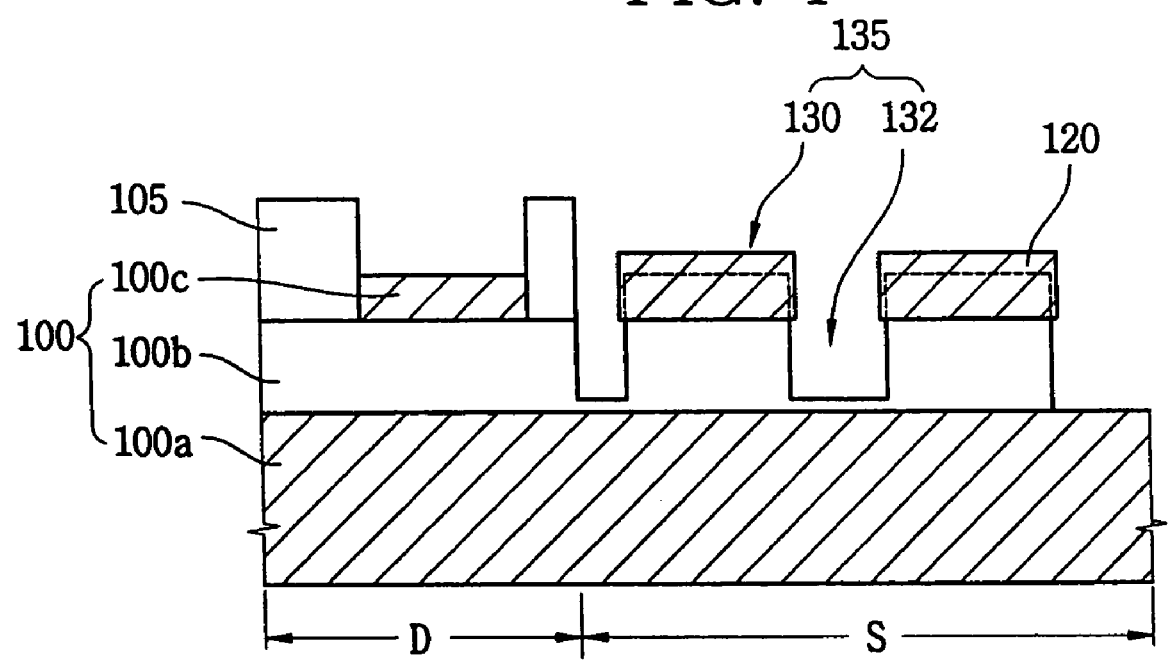
FIG. 4 is a cross sectional view illustrating an alignment mark in accordance with a second embodiment of the present invention.

FIG. 4 is a cross sectional view illustrating an alignment mark in accordance with a second embodiment of the present invention.

Referring to FIG. 4, an SOI substrate 100 includes a silicon substrate 100a, a buried oxide layer 100b and a silicon layer 100c. The SOI substrate 100 is defined a device region D and a scribe lane region S.

An active region and a field region are formed in the device region D. The active region includes the silicon layer 100c having an exposed upper face. The field region includes a field oxide layer 105 filling a trench that is formed at an upper portion of the SOI substrate 100. The field oxide layer 105 has a height higher than the silicon layer 100c.

An alignment mark 135 for aligning the SOI substrate 100 with a mask used in a photolithography process is formed on the scribe lane region S. The alignment mark 135 includes an alignment pattern 130 having the buried oxide layer 100b, the silicon layer 100c and a silicon epitaxial layer 120, and an alignment groove 132 adjacent to the alignment pattern 130.

The buried oxide layer 100b may partially remain on a bottom of the alignment groove 132. On the contrary, the buried oxide layer 100b in the alignment groove 112 may be entirely removed to expose a surface of the silicon substrate 100a. The buried oxide layer 100b may preferably remain on the bottom of the alignment groove 132.

Since the alignment pattern 130 includes the silicon epitaxial layer 120, an upper face of the alignment pattern 130 is higher than that of the silicon layer 100c in the active region.

FIGS. 5A to 5E are cross sectional views illustrating a method for forming an alignment mark in accordance with the second embodiment of the present invention.

Figure 5A:
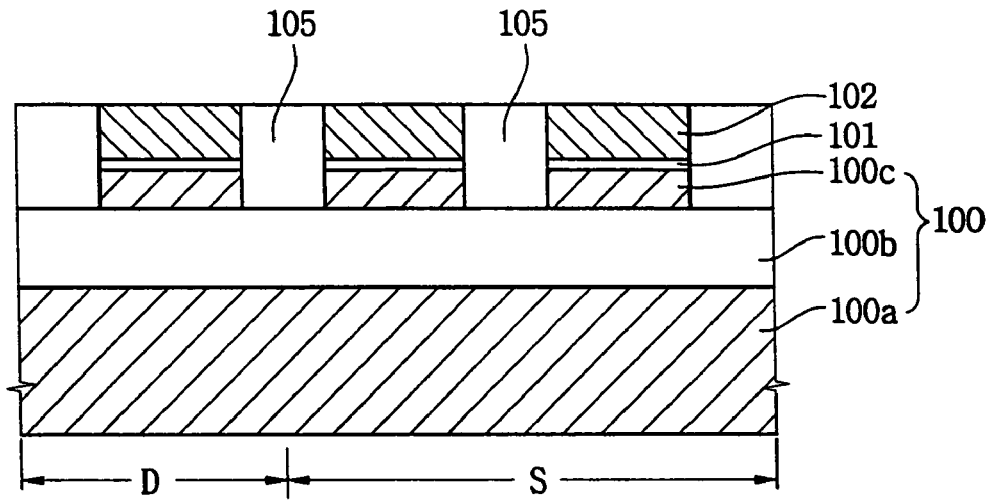
FIGS. 5A to 5E are cross sectional views illustrating a method for forming an alignment mark in accordance with the second embodiment of the present invention.

Referring to FIG. 5A, an SOI substrate 100 includes a silicon substrate 100a, a buried oxide layer 100b having a thickness of about 300 Å to about 5,000 Å and a silicon layer 100c having a thickness of about 500 Å to about 5,000 Å.

A pad oxide layer 101 is formed on the silicon layer 100c. A buffer layer 102 is formed on the pad oxide layer 101. The buffer layer 102 may include silicon nitride, silicon oxynitride, polysilicon or amorphous silicon. The buffer layer 102 may advantageously include silicon nitride that has a high etching selectivity and a high polishing selectivity relative to silicon oxide.

The buffer layer 102 and the silicon layer 100c in a field region are etched to form trench 104. A field oxide layer 105 is formed on the buffer layer and in the trench 104. The field oxide layer 105 is polished to expose the buffer layer 102.

Figure 5B:
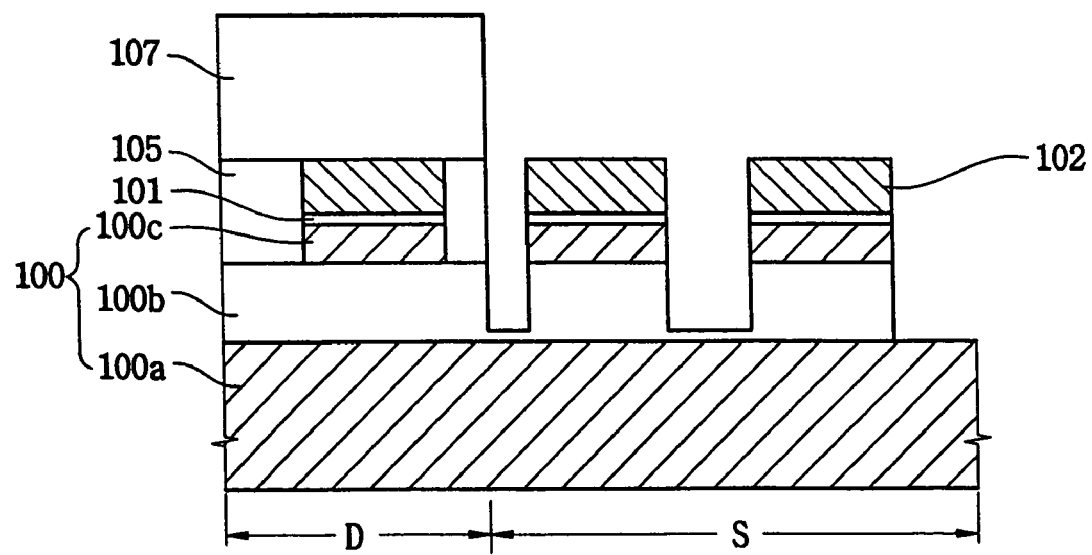

Referring to FIG. 5B, a photoresist pattern 107 is formed on the SOI substrate 100 to expose the scribe lane region S. The buried oxide layer 100b is dry etched using the photoresist pattern 107 as a mask and using an etchant that has an etching selectivity between the buried oxide layer 100b and the buffer layer 102. The etching selectivity between the buried oxide layer 100b and the buffer layer 102 is greater than about 5:1.

In particular, the field oxide layer 105 and the buried oxide layer 100b formed in the scribe lane region S are etched to form an alignment groove. Here, the buried oxide layer 105 may remain on a bottom of the alignment groove. Alternatively, the buried oxide layer 105 may be entirely removed to expose the silicon substrate 100a. An epitaxial layer may, however, grow on the exposed silicon substrate 100a. A high step between an alignment pattern and an alignment groove may be formed due to the epitaxial layer.

Figure 5C:
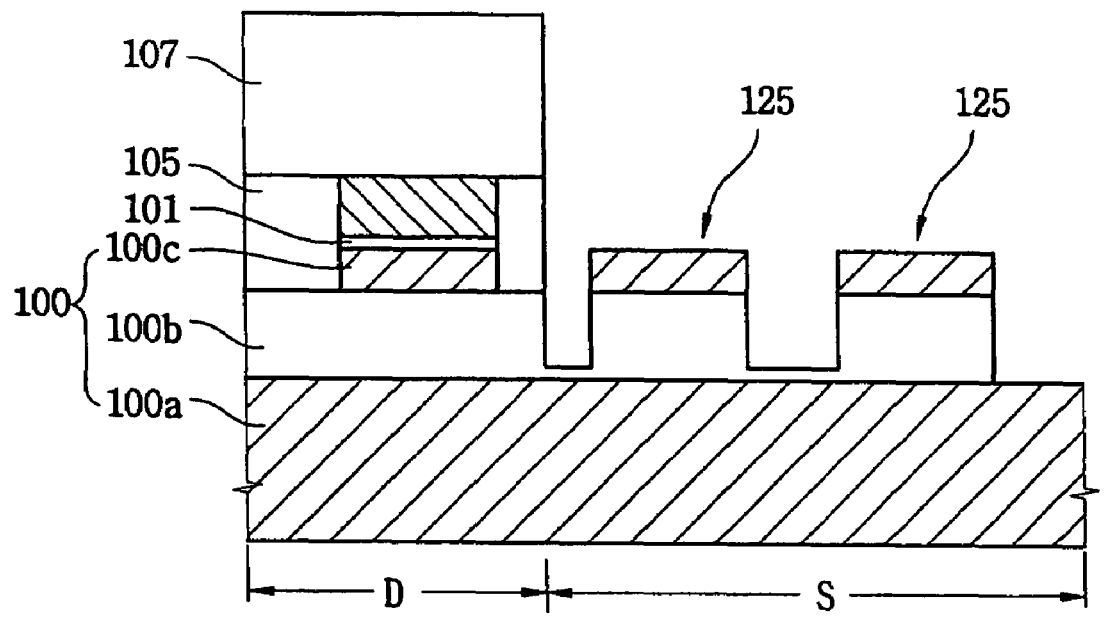

Referring to FIG. 5C, the buffer layer 102 and the pad oxide layer 111 remaining in the device region D and the scribe lane region S are selectively removed to form a preliminary alignment pattern 125 and an alignment groove. When the buffer layer 102 includes silicon nitride, the buffer layer 102 may be removed using a phosphoric acid solution. Alternatively, when the buffer layer 102 has a thin thickness, the buffer layer 102 may be simultaneously removed with etching of the field oxide layer 105 and the buried oxide layer 100b.

Figure 5D:
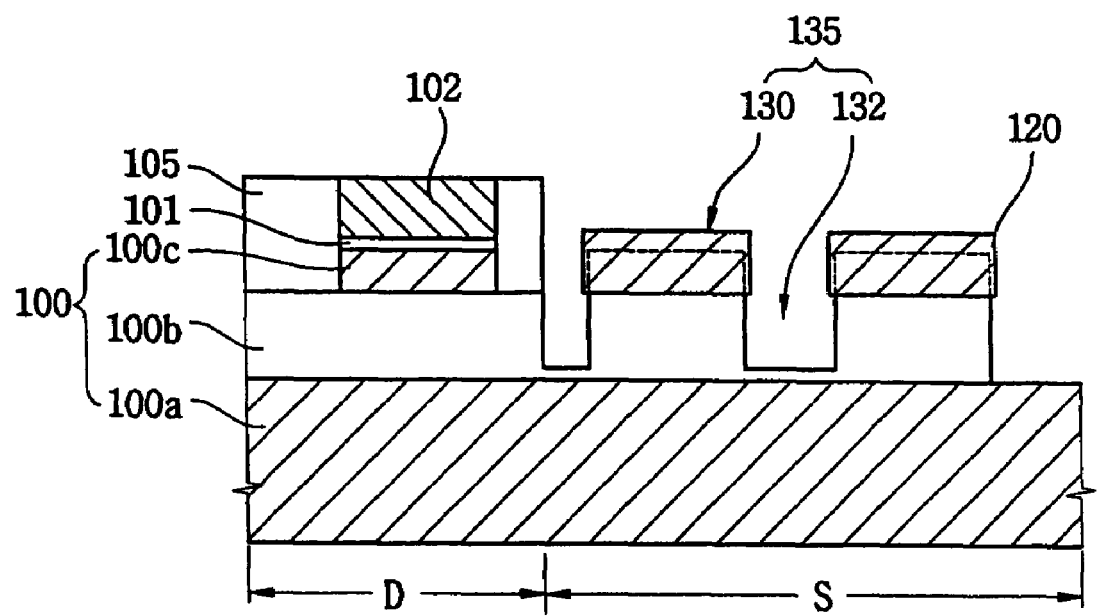

Referring to FIG. 5D, the photoresist pattern 107 is removed by a stripping process. The buffer layer 102 is positioned in the active region of the device region D. The upper face of the silicon layer 100c in the active region of the scribe lane region S is exposed.

An epitaxial growing process is performed on the SOI substrate 100 to grow a silicon epitaxial layer 120 on the exposed face of the silicon layer 100c. The silicon epitaxial layer 120 has a thickness of about 50 Å to about 1,000 Å. Accordingly, an alignment mark 130 including the buried oxide layer 100b, the silicon layer 100c and the silicon epitaxial layer 120 is formed on the silicon substrate 100a. A layer including the silicon layer 100c and the silicon epitaxial layer 120 has a thickness greater than that of the silicon layer 100c in the device region D.

Figure 5E:
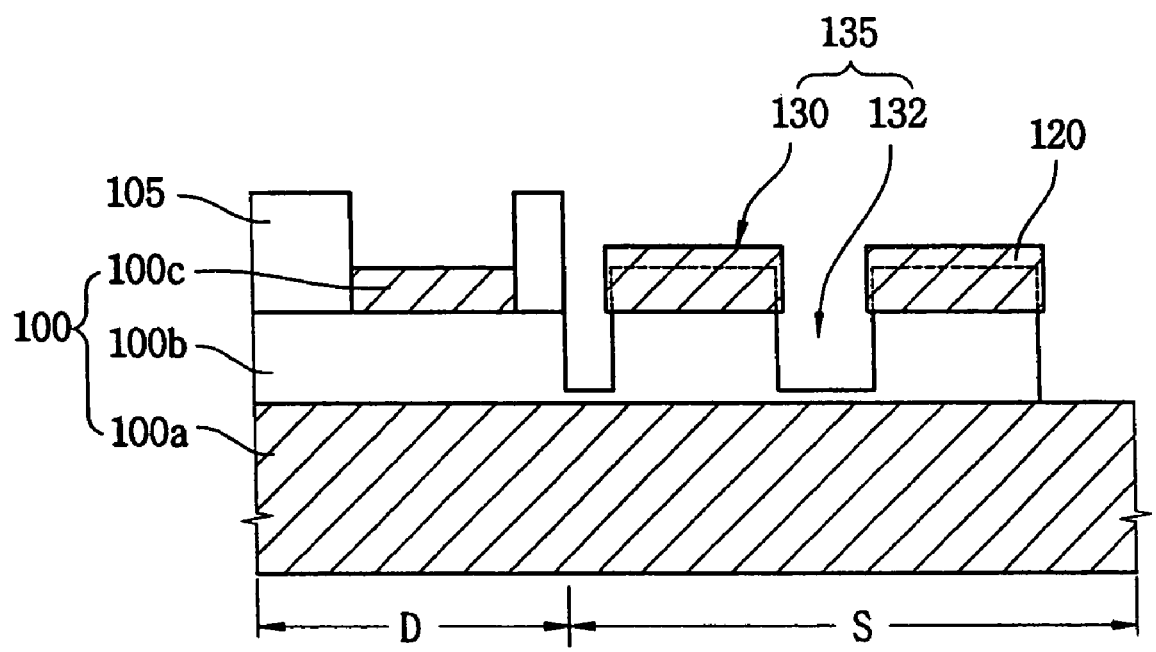

Referring to FIG. 5E, the buffer layer 102 remaining in the device region D is removed. Accordingly, an alignment mark 135 including the alignment pattern 130 and the alignment groove 132 adjacent to the alignment pattern 130 is formed.

When the silicon layer 100c in the SOI substrate 100 has a thickness of below about 300 Å, the alignment pattern 130 may be little damaged because the layer including the silicon layer 100c and the silicon epitaxial layer 120 has a thickness greater than that of the silicon layer 100c in the device region D. Additionally, the silicon layer 100c has a thin thickness so that a parasite capacitance may be reduced.

FIGS. 6A to 6D are cross sectional views illustrating a method for forming an alignment mark in accordance with a third embodiment of the present invention.

Figure 6A:
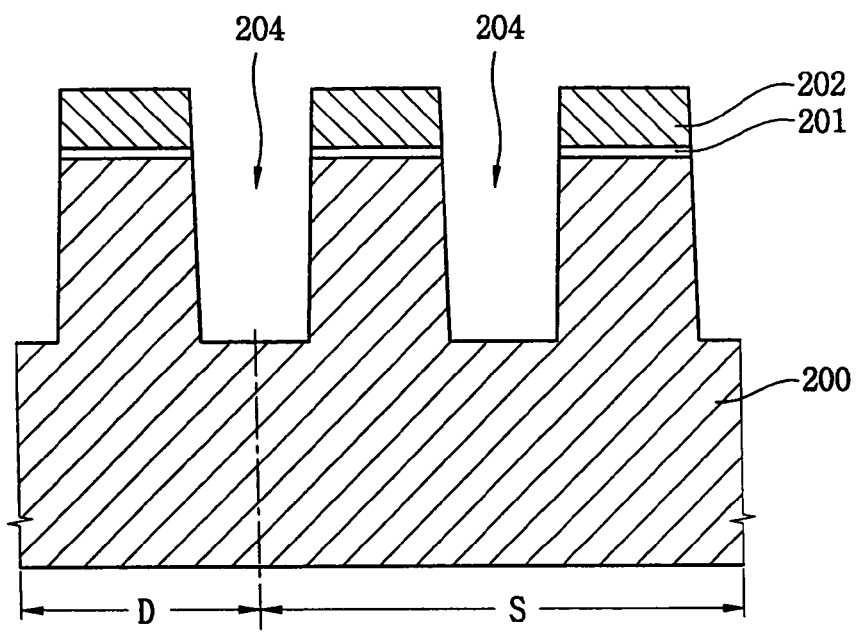
FIGS. 6A to 6D are cross sectional views illustrating a method for forming an alignment mark in accordance with a third embodiment of the present invention.

Referring to FIG. 6A, a pad oxide layer 201 having a thickness of about 10 Å to about 300 Å is formed on a bulk silicon substrate 200. A buffer layer 202 having a thickness of about 10 Å to about 10,000 Å is formed on the pad oxide layer 201. The buffer layer 202 may preferably have a thickness of about 300 Å to about 3,000 Å. The buffer layer 202 serves as a polishing stop layer in a successive polishing process and functions as a protection layer during a subsequent formation of an alignment mark. When the buffer layer 202 is too thin, the buffer layer 202 may partially be removed in the polishing process such that the buffer layer 202 may be not used as the protection layer. On the contrary, when the buffer layer 202 is too thick, it may be difficult to form a trench through the buffer layer 202.

After a silicon oxide layer used for forming the alignment mark is etched, the buffer layer 202 must remain on the pad oxide layer 201 to protect the silicon substrate 200. Thus, the buffer layer 202 has a thickness proportional to the etched thickness of the silicon oxide layer. The buffer layer 202 may include silicon nitride, silicon oxynitride, polysilicon or amorphous silicon. The buffer layer 202 may advantageously include silicon nitride that has a high etching selectivity and a high polishing selectivity relative to silicon oxide.

The buffer layer 202 and the silicon substrate 200 are etched to form trench 204 defining a field region. The trench 104 has a depth of about 2,00 Å to about 7,000 Å from the surface of the substrate 200. An active region and a field region may be isolated by forming a trench exposing a buried oxide layer of the SOI substrate. The silicon substrate 200, however, may not have the buried oxide layer. Accordingly, the trench 204 has a depth greater than that of the SOI substrate. The trench 204 is also formed at the field region of the scribe lane region S in which an alignment groove is subsequently formed.

Figure 6B:
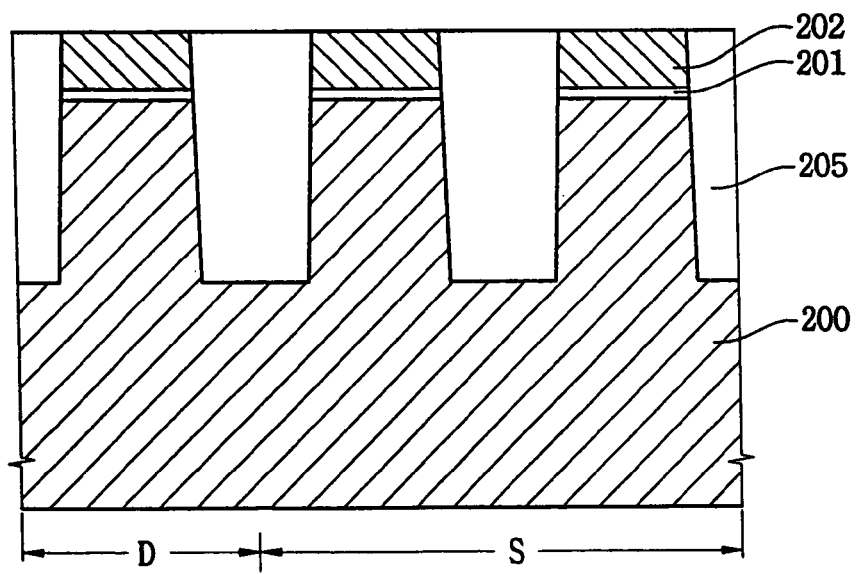

Referring to FIG. 6B, a field oxide layer 205 is formed on the buffer layer 202 and in the trench 204. The field oxide layer 205 may include silicon oxide. The field oxide layer 105 is polished for exposing the buffer layer 102 to form a field region.

Figure 6C:
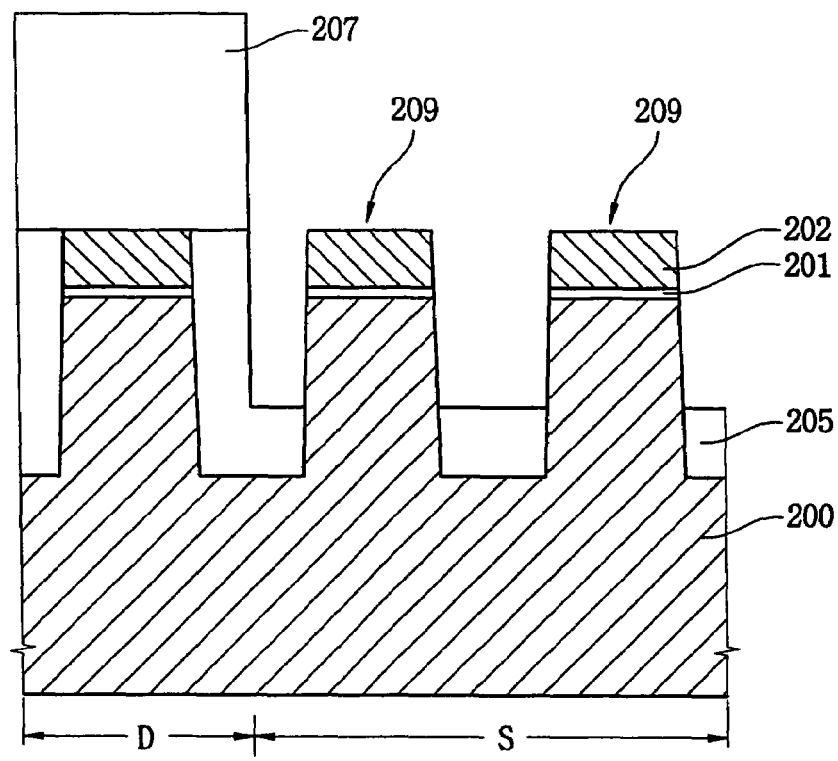

Referring to FIG. 6C, a photoresist pattern 207 is formed on the silicon substrate 200 to selectively expose the scribe lane region S. The field oxide layer 205 is dry etched using the photoresist pattern 207 as a mask and using an etchant that has an etching selectivity between the field oxide layer 205 and the buffer layer 202 to form an alignment groove. Here, the silicon substrate 200 is not exposed after the etching process of the field oxide layer 205. Particularly, the field oxide layer 205 is etched by a thickness of about 1,000 Å to about 2,000 Å from the surface of the silicon substrate 200 to form the alignment groove. Thus, a step is formed between the field region and the active region so that a preliminary alignment pattern 209 is formed in the active region adjacent to the alignment groove. The preliminary alignment pattern 209 includes the silicon substrate 200 and the buffer layer 202 subsequently stacked.

Figure 6D:
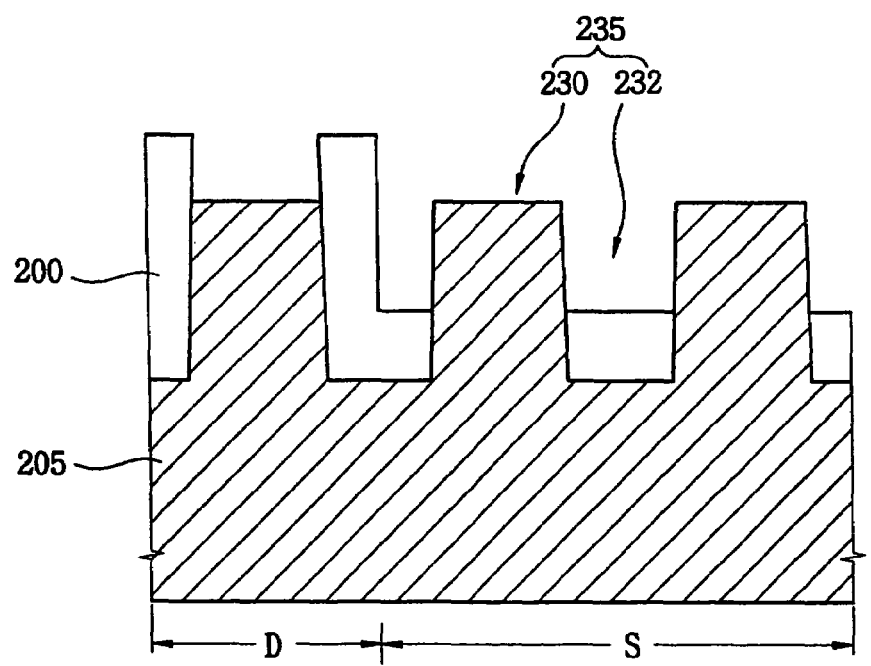

Referring to FIG. 6D, the photoresist pattern 207 is removed by a stripping process. The buffer layer 202 remaining in the device region D and the scribe lane region S is removed. When the buffer layer 202 includes silicon nitride, the buffer layer 202 may be removed using a phosphoric acid solution. As a result, an alignment mark 235 including an alignment pattern 230 and an alignment groove 232 is completed.

According to the present invention, the alignment pattern is little damaged in an etching process and a cleaning process because the silicon layer included in the alignment pattern protects the alignment pattern from an etchant and a cleaning solution. Therefore, exposure equipment readily recognizes the alignment pattern. As a result, a photoresist pattern used in the exposure process is accurately aligned.

Having described the preferred embodiments of the present invention, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A method for manufacturing a semiconductor device comprising:
   forming a buffer layer on a substrate that is divided into a device region and a scribe lane region;
   providing the scribe lane with a trench;
   filling the trench with an insulating layer;
   forming an alignment groove in the insulating layer that is disposed on the scribe lane region such that the insulating layer in the scribe lane region is completely etched; and
   removing the buffer layer remaining on the substrate.

2. The method of claim 1, wherein the buffer layer comprises silicon nitride, silicon oxynitride, polysilicon or amorphous silicon.

3. The method of claim 1, wherein forming the alignment groove comprises:
   forming a photoresist pattern for selectively exposing the scribe lane region on the insulating layer; and
   etching the insulating layer using the photoresist pattern and the buffer layer as an etching mask.

4. The method of claim 1, wherein the buffer layer has a thickness of about 300 Å to about 3,000 Å.

5. The method of claim 1, further comprising forming a pad oxide layer on the substrate prior to forming the buffer layer.

6. The method of claim 1, wherein the substrate comprises a silicon on insulator (SOI) substrate or a silicon bulk substrate.

7. The method of claim 1, wherein filling the trench with the insulating layer comprises:
   forming a silicon oxide layer on the buffer layer and in the trench; and
   removing the silicon oxide layer to expose a surface of the buffer layer.

8. A method for manufacturing a semiconductor device comprising:
   forming a buffer layer on a silicon on insulator (SOI) substrate including a silicon substrate, a buried oxide layer and a semiconductor layer, the SOI substrate being divided into a device region and a scribe lane region;
   providing the scribe lane region with a trench;
   filling the trench with a field oxide layer;
   forming an alignment groove in the field oxide layer that is disposed on the scribe lane region such that the field oxide layer in the scribe lane region is completely etched; and
   removing the buffer layer remaining on the SOI substrate.

9. The method of claim 8, wherein the buffer layer comprises silicon nitride, silicon oxynitride, polysilicon or amorphous silicon.

10. The method of claim 8, wherein forming the alignment groove comprises:

forming a photoresist pattern for selectively exposing the scribe lane region on the field oxide layer; and etching a silicon oxide layer in the scribe lane region using the photoresist pattern and the buffer layer as an etching mask.

11. The method of claim 10, wherein the silicon oxide layer comprises the field oxide layer and the buried oxide layer.

12. The method of claim 10, wherein the buried oxide layer, covers the silicon substrate disposed below the alignment groove after etching the silicon oxide layer.

13. The method of claim 10, wherein the buried oxide layer is entirely removed to expose the silicon substrate disposed below the alignment groove.

14. The method of claim 8, further comprising:

selectively removing the buffer layer remaining on the scribe lane region after forming the alignment groove; and epitaxially growing the semiconductor layer disposed in the scribe lane region.

15. The method of claim 14, wherein the epitaxial layer has a thickness of about 50 Å to about 1,000 Å.

16. The method of claim 8, wherein the buffer layer has a thickness of about 300 Å to about 3,000 Å.

17. The method of claim 8, further comprising forming a pad oxide layer on the substrate prior to forming the buffer layer.

18. The method of claim 8, wherein filling the trench with the insulating layer comprises:

forming a silicon oxide layer on the buffer layer and in the trench; and removing the silicon oxide layer to expose a surface of the buffer layer.

* * * * *